(12) United States Patent
Duan et al.

(10) Patent No.: US 12,379,608 B1
(45) Date of Patent: Aug. 5, 2025

(54) SINGLE-LAMP DUAL-PIXEL THREE-DIMENSIONAL (3D) LIGHT EMITTING DIODE (LED) DISPLAY MODULE

(71) Applicant: CANBEST OPTO-ELECTRICAL SCIENCE & TECHNOLOGY CO., LTD, Zhengzhou (CN)

(72) Inventors: Wantong Duan, Zhengzhou (CN); Shuzheng Li, Zhengzhou (CN)

(73) Assignee: CANBEST OPTO-ELECTRICAL SCIENCE & TECHNOLOGY CO., LTD, Zhengzhou (CN)

( * ) Notice: Subject to any disclaimer, the term of this patent is extended or adjusted under 35 U.S.C. 154(b) by 0 days.

(21) Appl. No.: 19/185,283

(22) Filed: Apr. 22, 2025

(30) Foreign Application Priority Data

Jul. 31, 2024 (CN) .......................... 202411043014.1

(51) Int. Cl.
*G02B 30/25* (2020.01)
*H05K 7/20* (2006.01)

(52) U.S. Cl.
CPC ......... *G02B 30/25* (2020.01); *H05K 7/20963* (2013.01)

(58) Field of Classification Search
None
See application file for complete search history.

(56) References Cited

U.S. PATENT DOCUMENTS

| 8,172,434 | B1* | 5/2012 | Olsson | F21V 7/0083 362/249.02 |
| 2013/0155723 | A1* | 6/2013 | Coleman | G02B 6/0028 362/621 |
| 2018/0010776 | A1* | 1/2018 | Shim | F21K 9/232 |

FOREIGN PATENT DOCUMENTS

| CN | 102419937 A | 4/2012 |
| CN | 110111696 A | 8/2019 |
| KR | 20140056788 A | 5/2014 |

* cited by examiner

*Primary Examiner* — Jyotsna V Dabbi
(74) *Attorney, Agent, or Firm* — Bayramoglu Law Offices LLC

(57) ABSTRACT

A novel single-lamp dual-pixel three-dimensional (3D) light emitting diode (LED) display module includes an LED integrated panel provided with an LED single-lamp array, where the LED single-lamp array is composed of a plurality of LED single lamps that are arranged symmetrically; the LED single lamp includes two LED light emitting pixels that are arranged left and right; the LED light emitting pixel includes a yellow LED bead, a green LED bead, and a blue LED bead; a left-right eye retardation film and a polarizing film are correspondingly provided on a front surface of the LED single-lamp array in sequence; a printed circuit board (PCB) is provided on a rear portion of the LED integrated panel; a driver chip is provided on the PCB; and the driver chip is configured to control the corresponding LED light emitting pixel in the LED single-lamp array to emit light according to a preset rule.

8 Claims, 7 Drawing Sheets

SINGLE-LAMP DUAL-PIXEL THREE-DIMENSIONAL (3D) LIGHT EMITTING DIODE (LED) DISPLAY MODULE

CROSS-REFERENCE TO THE RELATED APPLICATIONS

This application is based upon and claims priority to Chinese Patent Application No. 202411043014.1, filed on Jul. 31, 2024, the entire contents of which are incorporated herein by reference.

TECHNICAL FIELD

The present disclosure relates to the field of three-dimensional (3D) light emitting diode (LED) display, and in particular to a novel single-lamp dual-pixel 3D LED display module.

BACKGROUND

The light emitting diode (LED), referred to as a semiconductor-based electric light source, and also referred to as a semiconductor lamp, is a filament-free electric light source, which can directly convert electrical energy into light energy.

The LED display module is a novel electronic imaging device in which LEDs are arranged sequentially. For features such as high luminance, wide viewing angle, and long service life, the LED display module has been widely applied to outdoor advertising screens, etc.

With the development of display technologies, the applications of the LED display module are becoming increasingly extensive. The LED display module has been gradually developed from the previous two-dimensional (2D) display to the existing 3D display. According to the 3D LED display module, a left-eye image and a right-eye image of a flat-panel display (FPD) for displaying 3D information are respectively provided for a left eye and a right eye of the viewer through an optical modulation component. Then, two parallax images acquired can be synthesized by the brain of the viewer, thereby perceiving the 3D display. Without the eyewear of the glasses-dependent 3D, the naked-eye 3D display makes the viewer more comfortable.

The 3D LED display device (201110400624.9) in the prior art includes an LED dot-matrix display screen. A left polarizing film is attached to a front end of an odd column of beads of the LED dot-matrix display screen. A right polarizing film is attached to a front end of an even column of beads of the LED dot-matrix display screen. Alternatively, the left polarizing film is attached to a front end of an odd row of beads of the LED dot-matrix display screen. The right polarizing film is attached to a front end of an even row of beads of the LED dot-matrix display screen. A polarizing angle of the left polarizing film and a polarizing angle of the right polarizing film are formed into an angle of 90°. In this way, polarized light of a video image A formed by the odd column of beads (or odd row of beads) through the polarizing film is orthogonal to polarized light of a video image B formed by the even column of beads (or even row of beads) through the polarizing film. A control processing module is provided inside the LED dot-matrix display screen, and configured to control the odd column of beads and the even column of beads, or the odd row of beads and the even row of beads of the LED dot-matrix display screen, to display video signals of different paths. The control processing module is connected to a left-path video signal and a right-path video signal. The left-path video signal and the right-path video signal are two image signals photographed by a left camera and a right camera at different angles. The video image photographed by the left camera is only displayed by the odd column of beads (or odd row of beads) after processed by the control processing module. The video image photographed by the right camera is only displayed by the even column of beads (or even row of beads) after processed by the control processing module. Meanwhile, because of the polarizing films, the video images photographed by the two cameras are the image A and the image B, with polarized light transmitted from the polarizing films being formed into an angle of 90°.

However, the above application still has some defects. The LED dot-matrix display screen uses circular subpixels. Three types of subpixels are located in a same frame to form one pixel. The color filter in front of the display is prone to chromatic aberration, resulting dizziness of the viewer. Meanwhile, the LED dot-matrix display screen has a low resolution to affect the image quality.

Furthermore, heat of the LED integrated panel is generally dissipated through a heat sink. The above application cannot meet operation of the LED integrated panel at different powers, but can only control the operating temperature of the LED integrated panel within a relatively large range. Consequently, the LED integrated panel is frequently shocked by the temperature change, affecting luminous efficacy and service life of the LED.

SUMMARY

An objective of the present disclosure is to provide a novel single-lamp dual-pixel 3D LED display module. Through the dual-pixel design of the LED single lamp, and in cooperation with a control circuit and an LED integrated panel, the present disclosure further improves the resolution and viewing comfort of the display screen.

The present disclosure adopts following technical solutions:

A novel single-lamp dual-pixel 3D LED display module includes an LED integrated panel provided with an LED single-lamp array, where the LED single-lamp array includes a plurality of LED single lamps that are arranged symmetrically; the LED single lamps each include two LED light emitting pixels that are arranged left and right; the LED light emitting pixels each include a yellow LED bead, a green LED bead, and a blue LED bead; a left-right eye retardation film and a polarizing film are correspondingly provided on a front surface of the LED single-lamp array in sequence; a printed circuit board (PCB) is provided on a rear portion of the LED integrated panel; a driver chip is provided on the PCB; the driver chip is configured to control the corresponding LED light emitting pixel in the LED single-lamp array to emit light according to a preset rule; and an LED heat dissipation structure is provided behind the PCB.

Further, the LED single lamp includes a hollow lampshade and six LED beads provided on an inner rear end surface of the lampshade; the six LED beads are formed into the two LED light emitting pixels that are arranged symmetrically left and right; and a rear end of the LED bead is welded at a corresponding position of the PCB through a pin.

Further, the left-right eye retardation film includes a left eye retardation film and a right eye retardation film; and the left eye retardation film and the right eye retardation film are respectively provided in front of a corresponding left row of three beads and in front of a corresponding right row of three beads.

Further, the driver chip uses a single-chip dual-drive scanning circuit.

Further, an optical microcrystalline mask is further provided on a front surface of the LED integrated panel; the optical microcrystalline mask is formed between the LED integrated panel and the left-right eye retardation film by potting; and the optical microcrystalline mask is formed by a mixture of transparent crystal epoxy resin glue and a glass microsphere.

Further, the LED heat dissipation structure includes a heat-dissipating aluminum plate provided at a rear end of the LED integrated panel; a temperature sensing mechanism is further provided behind the heat-dissipating aluminum plate; the temperature sensing mechanism includes a hollow heat transfer cartridge provided on a rear surface of the heat-dissipating aluminum plate; an inner cavity of the heat transfer cartridge is further concentrically provided with a thermal expansion portion; the thermal expansion portion is slidably connected to the heat transfer cartridge; the thermal expansion portion includes an energy storage cartridge; the energy storage cartridge is shaped as a barrel with a rear end open and a front end sealed; a first flange plate is provided on a rear end surface of the energy storage cartridge; a plunger accommodation cartridge is further inserted into an opening at the rear end of the energy storage cartridge; a second flange plate is provided on a rear end surface of the plunger accommodation cartridge; the plunger accommodation cartridge is suspended on a rear portion of the energy storage cartridge; a front surface of the second flange plate of the plunger accommodation cartridge is closely attached to a rear end surface of the first flange plate; an outer surface of the plunger accommodation cartridge and an inner surface of the energy storage cartridge form a confined space; a plunger is further inserted into the plunger accommodation cartridge; a rear end of the plunger protrudes from the rear end surface of the plunger accommodation cartridge; the plunger accommodation cartridge is made of an elastic rubber material; and paraffin is filled in the confined space formed by the outer surface of the plunger accommodation cartridge and the inner surface of the energy storage cartridge.

Further, an avoidance hole is formed at an axis of a bottom cover of the heat transfer cartridge; the energy storage cartridge is inserted into the avoidance hole and slidably connected to the bottom cover of the heat transfer cartridge; a front end surface of a top cover of the heat transfer cartridge abuts against a rear end surface of the plunger; a reset spring is further sleeved on the energy storage cartridge; and the reset spring includes one end fixed on the rear portion of the energy storage cartridge, and the other end fixed on a rear end surface of the bottom cover of the heat transfer cartridge.

Further, a heat dissipation fin adjusting mechanism is further provided behind the heat transfer cartridge; the heat dissipation fin adjusting mechanism includes a changeable transfer portion and a heat dissipation portion; the changeable transfer portion is provided behind the heat transfer cartridge; the changeable transfer portion includes a helical sleeve and a changeable heat transfer fin; the helical sleeve is sleeved on the changeable heat transfer fin; the helical sleeve and a top cover of the heat transfer cartridge are provided concentrically; the changeable heat transfer fin includes a stationary fin provided eccentrically with the top cover of the heat transfer cartridge; the stationary fin is shaped as a circular disc and fixedly connected to the top cover of the heat transfer cartridge through a concentrically provided heat transfer pillar; a plurality of uniformly-spaced stationary fins are fixed on a rear portion of the heat transfer pillar; a rotary fin is inserted into a gap between two adjacent ones of the uniformly-spaced stationary fins; and the rotary fin includes an inner end inserted into the gap between the two adjacent uniformly-spaced stationary fins, and an outer end fixed on an inner wall of the helical sleeve.

Further, a helical groove is formed in an outer surface of the helical sleeve; a cylindrical pin is provided in the helical groove; the cylindrical pin is provided along a radial direction of the helical sleeve; and an inner end of the cylindrical pin is slidably connected to the corresponding helical groove.

Further, a drive sleeve is fixed at an outer end of the cylindrical pin; a bottom of the drive sleeve extends through the top cover of the heat transfer cartridge via a guide rod, and is fixedly connected to the energy storage cartridge; the top cover of the heat transfer cartridge is provided with a through hole corresponding to the guide rod; and the top cover of the heat transfer cartridge is slidably connected to the guide rod.

With a structure in which six beads are provided in the LED single lamp in two rows, the present disclosure improves a level of pixel integration of the LED single lamp, and further improves the resolution and image quality.

The present disclosure significantly expands a viewing angle of the 3D LED display module with the optical microcrystalline mask, and increases an image filling rate of the dual-pixel LED bead with diffusion of the glass microsphere.

In the figures: 1: LED integrated panel, 2: left-right eye retardation film, 3: polarizing film, 4: temperature sensing mechanism, 5: heat dissipation fin adjusting mechanism, 6: heat transfer cartridge, 7: inner cavity of the heat transfer cartridge, 8: thermal expansion portion, 9: energy storage cartridge, 10: reset spring, 11: first flange plate, 12: plunger accommodation cartridge, 13: plunger, 14: changeable transfer portion, 15: heat dissipation portion, 16: helical sleeve, 17: changeable heat transfer fin, 18: stationary fin, 19: heat transfer pillar, 20: rotary fin, 21: helical groove, 22: cylindrical pin, 23: drive sleeve, 24: guide rod, 25: heat dissipation fin, 26: electric fan, 27: dovetail groove, 28: dovetail pin, 29: second flange plate, 30: avoidance hole, 31: through hole, 32: quick connection structure, 33: circular end cover, 34: guide hole, 35: heat-dissipating aluminum plate, 36: LED heat dissipation structure, 37: left eye retardation film, 38: right eye retardation film, 39: LED single lamp, 40: bead, and 41: optical microcrystalline mask.

DETAILED DESCRIPTION OF THE EMBODIMENTS

The present disclosure is described in detail below with reference to the drawings and embodiments.

Figure 1:
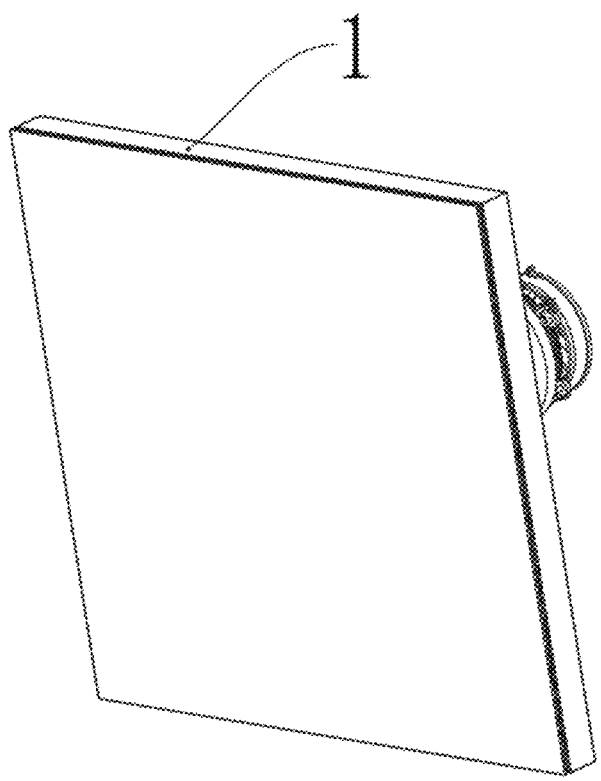
FIG. 1 is a schematic structural view of an LED integrated panel according to the present disclosure.
Figure 2:
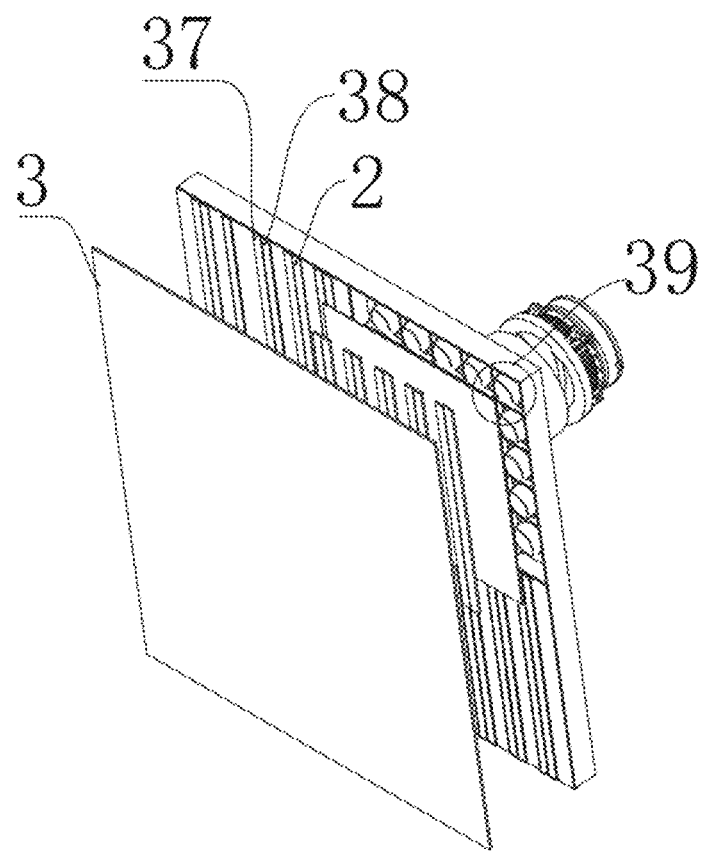
FIG. 2 is a schematic structural view of a left-right eye retardation film according to the present disclosure.
Figure 3:
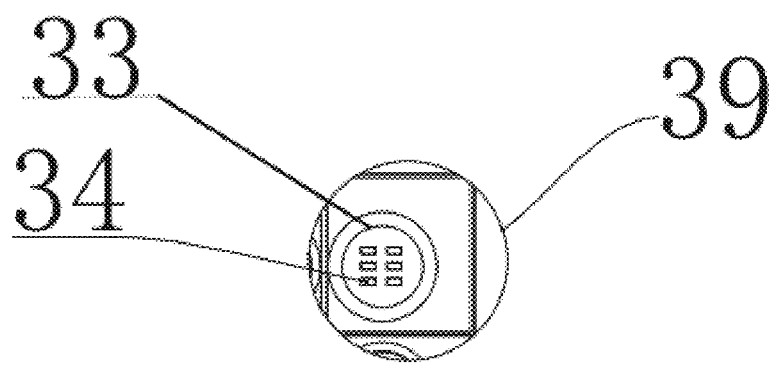
FIG. 3 is a schematic structural view of an LED single lamp according to the present disclosure.
Figure 4:
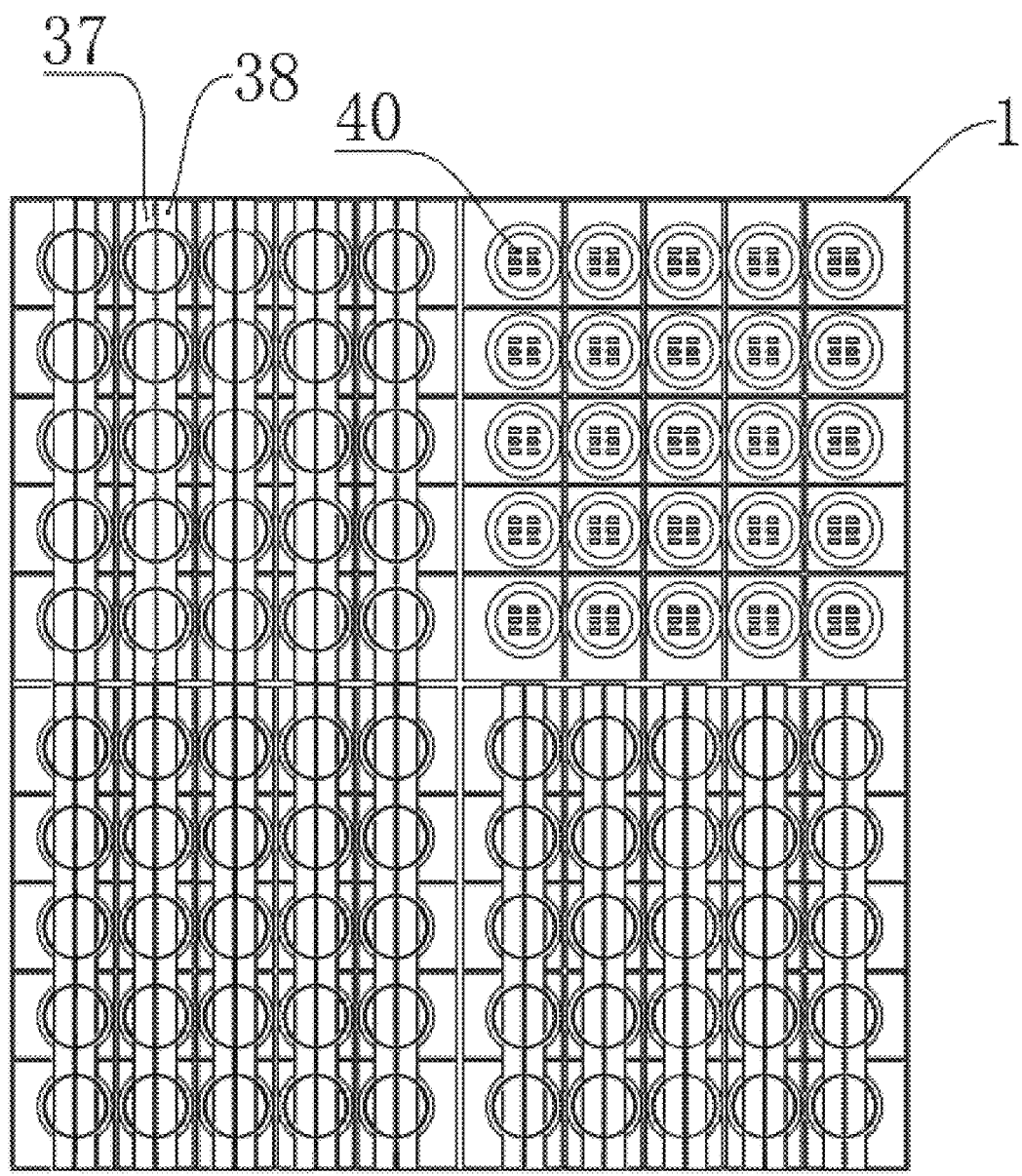
FIG. 4 is a schematic structural view of a bead according to the present disclosure.
Figure 5:
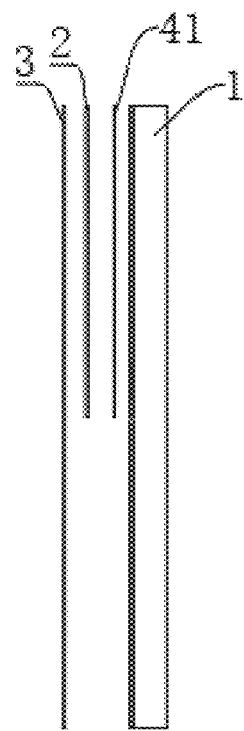
FIG. 5 is a schematic structural view of an optical microcrystalline mask according to the present disclosure.
Figure 6:
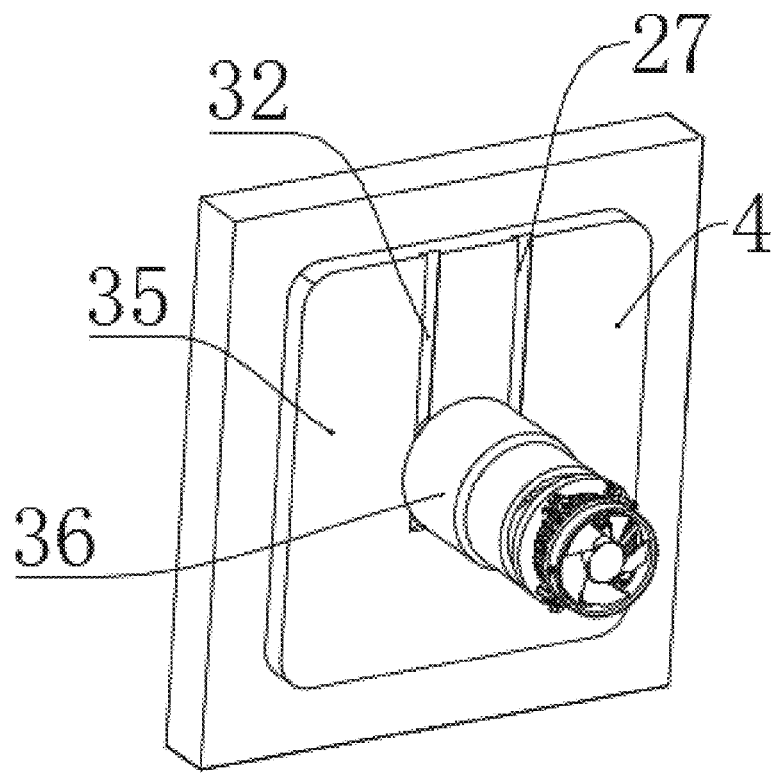
FIG. 6 is a schematic structural view of a temperature sensing mechanism according to the present disclosure.
Figure 7:
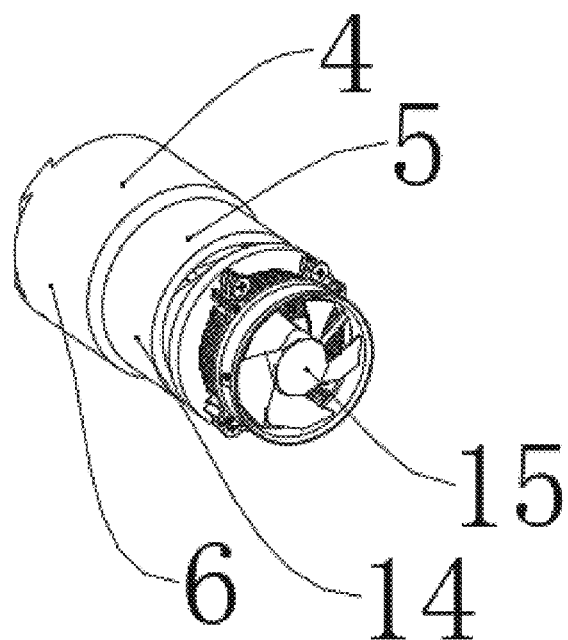
FIG. 7 is a schematic structural view of a heat dissipation fin adjusting mechanism according to the present invention.
Figure 8:
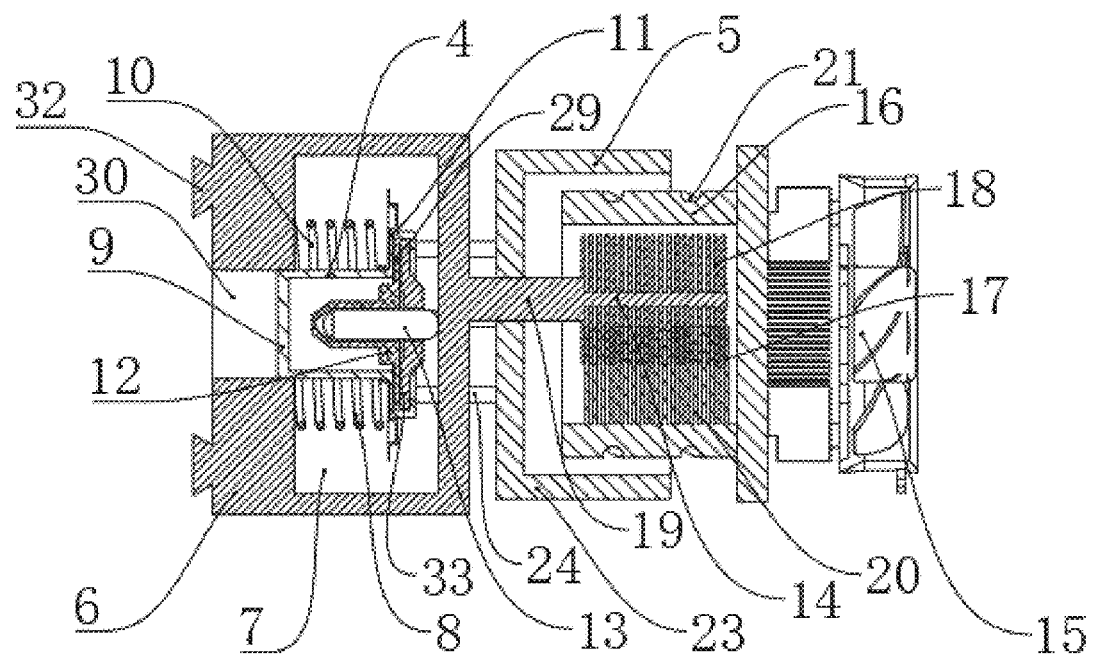
FIG. 8 is a schematic structural view of an inner cavity of a heat transfer cartridge according to the present disclosure.
Figure 9:
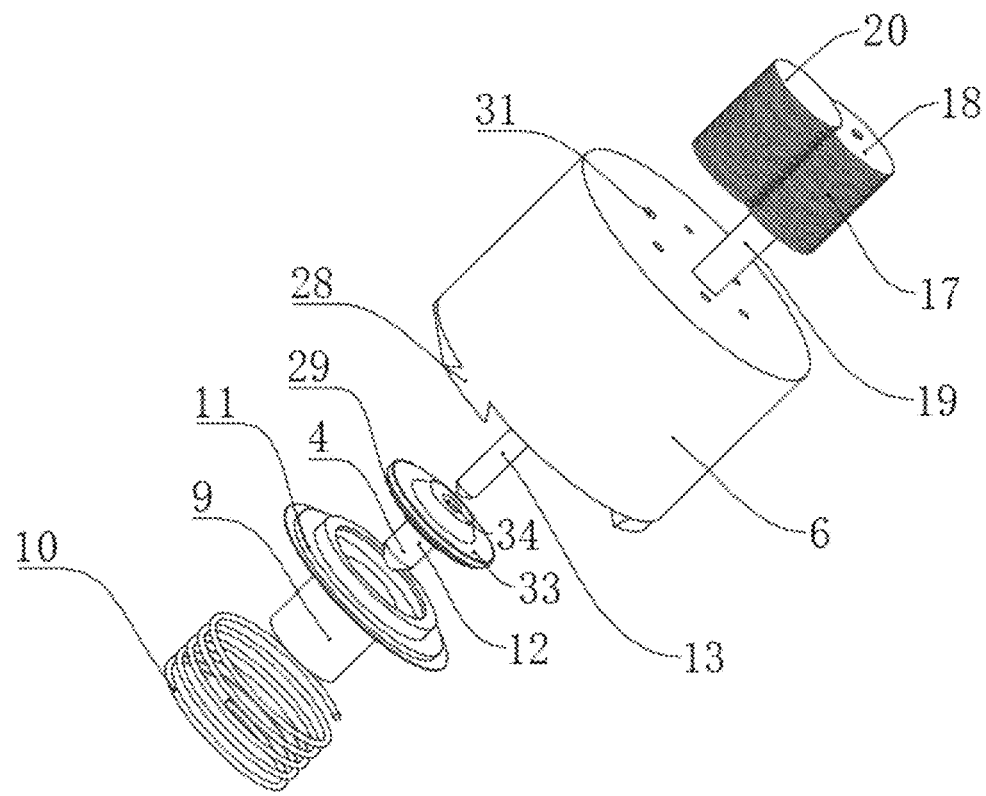
FIG. 9 is a schematic structural view of a first flange plate according to the present disclosure.
Figure 10:
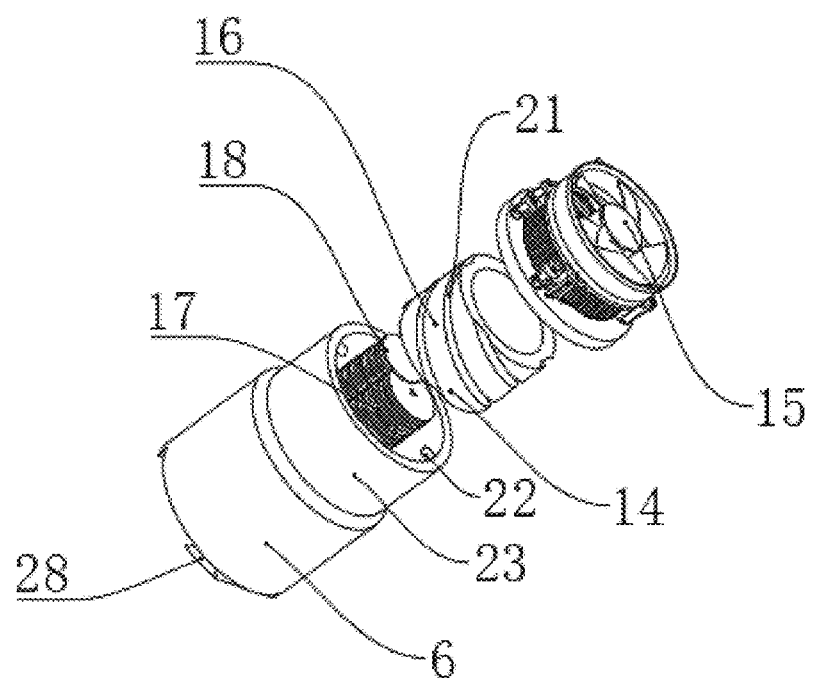
FIG. 10 is a schematic structural view of a helical groove according to the present disclosure.
Figure 11:
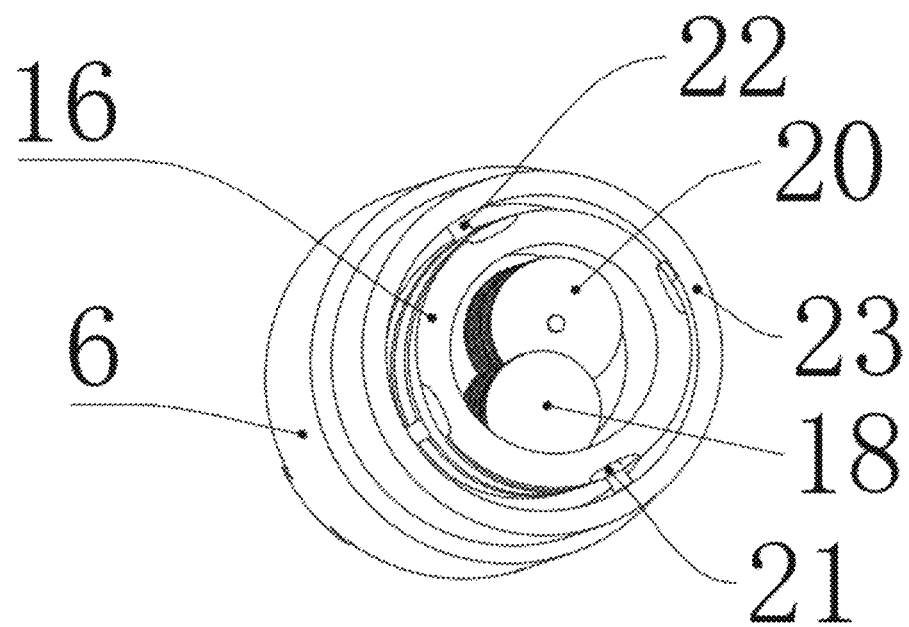
FIG. 11 is a schematic structural view of a rotary fin according to the present disclosure.
Figure 12:
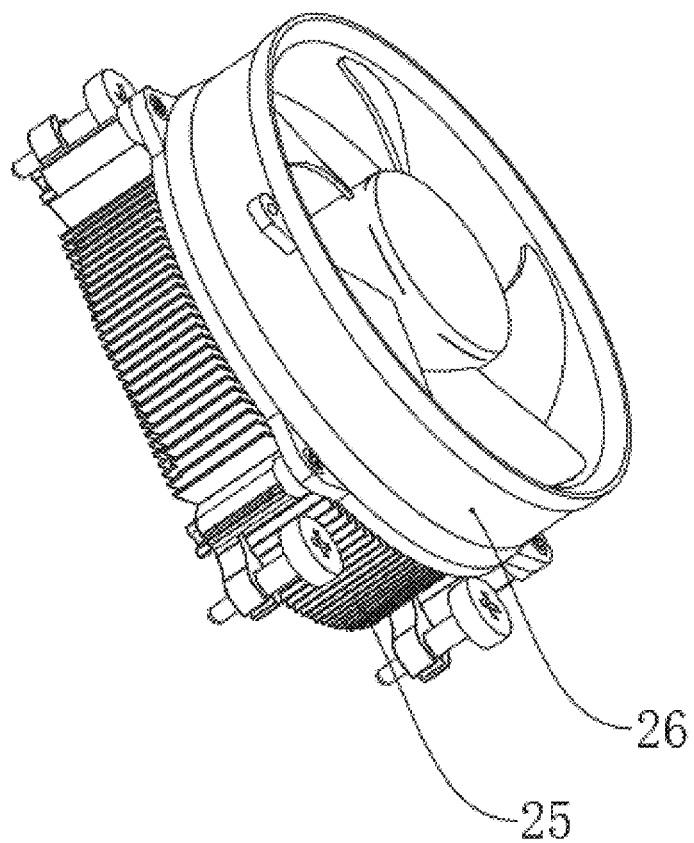
FIG. 12 is a schematic structural view of an electric fan according to the present disclosure.

As shown in FIG. 1 to FIG. 12, the present disclosure provides a novel single-lamp dual-pixel 3D LED display module, including LED integrated panel 1 provided with an LED single-lamp array. The LED single-lamp array includes a plurality of LED single lamps that are arranged symmetrically. The LED single lamps each include two LED light emitting pixels that are arranged left and right. The LED light emitting pixels each include a yellow LED bead, a green LED bead, and a blue LED bead. Left-right eye retardation film 2 and polarizing film 3 are correspondingly provided on a front surface of the LED single-lamp array in sequence. A PCB is provided on a rear portion of the LED integrated panel 1. A driver chip is provided on the PCB. The driver chip is configured to control the corresponding LED light emitting pixel in the LED single-lamp array to emit light according to a preset rule. Since the PCB heats continuously in operation, LED heat dissipation structure 36 is further provided behind the PCB, and configured to dissipate heat from the PCB to keep PCB within a reasonable temperature range all the time.

In order to improve a level of pixel integration of the LED single lamp 39, and further improve the resolution and image quality, in the present disclosure, the LED single lamp 39 includes a hollow lampshade and six LED beads 40 provided on an inner rear end surface of the lampshade. The six LED beads 40 are formed into the two LED light emitting pixels that are arranged symmetrically left and right. The LED light emitting pixel includes the yellow LED bead, the green LED bead, and the blue LED bead. A rear end of the LED bead 40 is welded at a corresponding position of the PCB through a pin.

By providing six beads 40 in the same LED single lamp 39 in left and right rows, there are two pixels in the same LED single lamp 39. This further improves the level of pixel integration of the LED single lamp.

When the present disclosure is used, when a 2D image is to be displayed, the two LED pixels in the LED single lamp 39 display a same image at the same time. When a 3D image is to be displayed, the two LED pixels in the LED single lamp 39 respectively display a left-handed image and a right-handed image. That is, an image observed by a left eye of a user is not synchronous with an image observed by a right eye, and two parallax images are synthesized by a brain of the user, thereby perceiving the 3D display.

In the operation of the 3D LED display module, light of the bead 40 is captured by the human eyes, and imaged through the human brain, so as to achieve corresponding angles of the left eye and the right eye for observing a same object, and synthesize the two parallax images in the brain to perceive the 3D display.

In the present disclosure, the left-right eye retardation film 2 includes left eye retardation film 37 and right eye retardation film 38. The left eye retardation film 37 and the right eye retardation film 38 are respectively provided in front of a corresponding left row of three beads 40 and in front of a corresponding right row of three beads 40.

In order that the present disclosure can effectively improve the 3D dual-image synchronization, synchronization of signal transmission, and stability of image quality to prevent 3D dizziness, in the present disclosure, the driver chip uses a single-chip dual-drive scanning circuit to update a displayed video image in real time, such that spatial orientation of the video image keeps synchronous with the two eyes of the user. This reduces a phenomenon of the 3D dizziness of the user in use, greatly reduces a likelihood of dizziness, nausea, and vomit of the user, and improves user satisfaction.

In order to improve a contrast of the 3D LED display module, and reduce reflection, in the embodiment, optical microcrystalline mask 41 is further provided on a front surface of the LED integrated panel 1. The optical microcrystalline mask 41 is formed between the LED integrated panel 1 and the left-right eye retardation film 2 by potting. The optical microcrystalline mask 41 is formed by a mixture of transparent crystal epoxy resin glue and a glass microsphere. By adding the glass microsphere to the transparent crystal epoxy resin glue, the cured optical microcrystalline mask 41 reaches a preset hardness. The transparent crystal epoxy resin glue ensures adhesion with the glass microsphere, while the glass microsphere ensures the hardness of the optical microcrystalline mask 41. The glass microsphere functions to diffuse light of the LED bead 40, such that a viewing angle of the 3D LED display module is expanded. With diffusion of the glass microsphere, an image filling rate of the dual-pixel LED bead 40 is increased.

In the operation of the 3D LED display module, a control unit provided in the PCB on the rear portion of the LED integrated panel 1 will produce a large amount of heat, and the PCB can operate normally only in an environment at −20° C. to 65° C. The PCB suffers thermal shock as the temperature changes constantly, thus greatly shortening the service life of the 3D LED display module.

In order to stabilize an operating temperature of the PCB, and prolong the service life of the 3D LED display module, in the present disclosure, the LED heat dissipation structure 36 includes heat-dissipating aluminum plate 35 provided at a rear end of the LED integrated panel 1. Temperature sensing mechanism 4 is further provided behind the heat-dissipating aluminum plate 35. In the operation, the heat of the LED integrated panel 1 is transferred to the temperature sensing mechanism 4 through the heat-dissipating aluminum plate 35. The temperature sensing mechanism is configured to convert the heat of the LED integrated panel 1 into a driving force, thereby driving heat dissipation fin adjusting mechanism 5 to change a heat dissipating capacity.

In the present disclosure, the heat dissipation fin adjusting mechanism 5 is further provided behind the temperature sensing mechanism 4. In the operation, through the changeable driving force of the temperature sensing mechanism 4, the heat dissipation fin adjusting mechanism 5 is driven to adjust the heat dissipating capacity of the LED heat dissipation structure 36. This adjusts an environmental temperature of the LED integrated panel 1 in the operation to prolong the service life of the LED integrated panel 1.

In order that the heat of the LED integrated panel 1 can be converted into a temperature signal more accurately, in the present disclosure, the temperature sensing mechanism 4 includes the heat-dissipating aluminum plate 35 closely attached behind the LED integrated panel 1. Hollow heat transfer cartridge 6 is further provided on a rear surface of the heat-dissipating aluminum plate 35. An outer wall of the heat transfer cartridge 6 is made of metal copper with desirable thermal conductivity. In the operation, the heat of the LED integrated panel 1 is transferred to the outer wall of the heat transfer cartridge 6 through the heat-dissipating aluminum plate 35. The heat is transferred to inner cavity 7 of the heat transfer cartridge through a temperature rise of the outer wall of the heat transfer cartridge 6.

In order that the heat of the LED integrated panel 1 can be converted into the temperature signal more accurately, in the present disclosure, the inner cavity 7 of the heat transfer cartridge is further concentrically provided with thermal expansion portion 8. The thermal expansion portion 8 is slidably connected to the heat transfer cartridge 6. The thermal expansion portion 8 includes energy storage cartridge 9. The energy storage cartridge 9 is shaped as a barrel with a rear end open and a front end sealed. First flange plate 11 is provided on a rear end surface of the energy storage cartridge 9. Plunger accommodation cartridge 12 is further inserted into an opening at the rear end of the energy storage cartridge 9. Second flange plate 29 is provided on a rear end surface of the plunger accommodation cartridge 12. The plunger accommodation cartridge 12 is suspended on a rear portion of the energy storage cartridge 9. A front surface of the second flange plate 29 of the plunger accommodation cartridge 12 is closely attached to a rear end surface of the first flange plate 11. An outer surface of the plunger accommodation cartridge 12 and an inner surface of the energy storage cartridge 9 form a confined space. Plunger 13 is further inserted into the plunger accommodation cartridge 12. A rear end of the plunger 13 protrudes from the rear end surface of the plunger accommodation cartridge 12. In the embodiment, the plunger accommodation cartridge 12 is made of an elastic rubber material. Paraffin is filled in the confined space formed by the outer surface of the plunger accommodation cartridge 12 and the inner surface of the energy storage cartridge 9. In the operation, the paraffin melts when heated, changing from a solid into a liquid. As a volume of the paraffin expands constantly, a pressure in the confined space is increased continuously. The pressure squeezes the plunger accommodation cartridge 12 from the outside, such that a volume in the plunger accommodation cartridge 12 is decreased constantly, and a front end surface of the plunger 13 is squeezed continuously. Under an action of the pressure, the plunger 13 and the plunger accommodation cartridge 12 move relatively, thereby converting the heat of the LED integrated panel 1 into the driving force.

In order to realize relative movement between the plunger 13 and the plunger accommodation cartridge 12 in the inner cavity 7 of the heat transfer cartridge, in the embodiment, avoidance hole 30 is formed at an axis of a bottom cover of the heat transfer cartridge 6. The energy storage cartridge 9 is inserted into the avoidance hole 30 and slidably connected to the bottom cover of the heat transfer cartridge 6. A front end surface of a top cover of the heat transfer cartridge 6 abuts against a rear end surface of the plunger 13. Reset spring 10 is further sleeved on the energy storage cartridge 9. The reset spring 10 includes one end fixed on the rear portion of the energy storage cartridge 9, and the other end fixed on a rear end surface of the bottom cover of the heat transfer cartridge 6. In a natural state of the reset spring 10, the plunger 13 is located at a bottom of the plunger accommodation cartridge 12. That is, a pressure outside the plunger accommodation cartridge 12 is insufficient to drive the plunger 13 and the energy storage cartridge 9 to move relatively. When the pressure outside the plunger accommodation cartridge 12 starts to increase, and is sufficient to drive the plunger 13 and the energy storage cartridge 9 to move relatively, a space of the inner cavity of the plunger accommodation cartridge 12 is compressed. There is a pressure to drive the plunger 13, such that the plunger 13 tends to move backward. Since an inner side of the top cover of the heat transfer cartridge 6 abuts against a rear surface of the plunger 13, the energy storage cartridge 9 pushed by a counter-acting force moves forward along the avoidance hole 30. The reset spring 10 is compressed, until a spring pressure is sufficient to balance a pressure caused by the change of the paraffin from the solid to the liquid in the energy storage cartridge 9.

In order to allow a mechanical motion to drive the heat dissipation fin adjusting mechanism 5 to adjust the heat dissipating capacity according to different heat of the LED integrated panel 1, thereby adjusting the environmental temperature of the LED integrated panel 1 in the operation, in the embodiment, the heat dissipation fin adjusting mechanism 5 is further provided behind the heat transfer cartridge 6. The heat dissipation fin adjusting mechanism 5 includes changeable transfer portion 14 and heat dissipation portion 15. The changeable transfer portion 14 is provided behind the heat transfer cartridge 6. The changeable transfer portion 14 includes helical sleeve 16 and changeable heat transfer fin 17. The helical sleeve 16 is sleeved on the changeable heat transfer fin 17. The helical sleeve 16 and the top cover of the heat transfer cartridge 6 are provided concentrically. The changeable heat transfer fin 17 includes stationary fin 18 provided eccentrically with the top cover of the heat transfer cartridge 6. The stationary fin 18 is shaped as a circular disc and fixedly connected to the top cover of the heat transfer cartridge 6 through concentrically provided heat transfer pillar 19. In order to enhance a heat transfer effect, in the embodiment, a plurality of uniformly-spaced stationary fins 18 are fixed on a rear portion of the heat transfer pillar 19. Rotary fin 20 is inserted into a gap between two adjacent ones of the uniformly-spaced stationary fins 18. The rotary fin 20 includes an inner end inserted into the gap between the two adjacent uniformly-spaced stationary fins 18, and an outer end fixed on an inner wall of the helical sleeve 16.

In the operation, the helical sleeve 16 rotates along an axis, thereby driving the rotary fin 20 to rotate around the axis. The inner end of the rotary fin 20 rotates around the eccentrically provided stationary fin 18. A contact area between the stationary fin 18 and the rotary fin 20 inserted into the gap between the two adjacent stationary fins 18 changes. The heat dissipating capacity also changes with the change of the contact area.

In order to drive the helical sleeve 16 to rotate along the axis, in the present disclosure, helical groove 21 is further formed in an outer surface of the helical sleeve 16. Cylindrical pin 22 is provided in the helical groove 21. The cylindrical pin 22 is provided along a radial direction of the helical sleeve 16. An inner end of the cylindrical pin 22 is slidably connected to the corresponding helical groove 21. In the operation, the cylindrical pin 22 moves back and forth, such that the helical sleeve 16 rotates with a curvature of the helical groove 21.

In order that when the heat of the LED integrated panel 1 changes, the cylindrical pin 22 can be driven by the temperature signal to move back and forth, thereby driving the helical sleeve 16 to rotate with the curvature of the helical groove 21, and changing a heat transfer area of the fin to adjust the heat dissipating capacity, in the embodiment, drive sleeve 23 is fixed at an outer end of the cylindrical pin 22. A bottom of the drive sleeve 23 extends through the top cover of the heat transfer cartridge 6 through guide rod 24, and is fixedly connected to the energy storage cartridge 9. The top cover of the heat transfer cartridge 6 is provided with through hole 31 corresponding to the guide rod 24. The top cover of the heat transfer cartridge 6 is slidably connected to the guide rod 24.

In the embodiment, heat dissipation portion 15 is further provided on a rear end surface of the changeable transfer portion 14. The heat dissipation portion 15 includes heat dissipation fin 25 and electric fan 26 provided behind the heat dissipation fin 25. In the operation, the electric fan 26 is driven by an internal motor, so as to accelerate airflow in the heat dissipation fin 25, and facilitate heat dissipation of the heat dissipation fin 25. The driving process of the electric fan 26 belongs to the prior art, and is not repeated herein.

In order that the LED heat dissipation structure 36 can be closely attached to the heat-dissipating aluminum plate 35, in the embodiment, quick connection structure 32 is further provided on a rear surface of the heat-dissipating aluminum plate 35. The quick connection structure 32 includes dovetail groove 27 provided on a rear portion of the heat-dissipating aluminum plate 35 and dovetail pin 28 correspondingly provided on a front portion of the heat transfer cartridge 6. In the operation, the dovetail pin 28 on the front portion of the heat transfer cartridge 6 moves up, such that the LED heat dissipation structure 36 is separated from the rear portion of the LED integrated panel 1. The dovetail pin 28 on the front portion of the heat transfer cartridge 6 moves down, such that the LED heat dissipation structure 36 is fixed at the rear end of the LED integrated panel 1.

In order to allow the plunger 13 to form a horizontal motion trajectory, in the embodiment, circular end cover 33 is further concentrically provided at the rear end of the plunger accommodation cartridge 12. The circular end cover 33 is fixedly connected to the rear end of the plunger accommodation cartridge 12. Guide hole 34 corresponding to the plunger 13 is formed in a center of the circular end cover 33. The plunger 13 extends through the guide hole 34 and is slidably connected to the circular end cover 33.

According to the novel single-lamp dual-pixel 3D LED display module provided by the present disclosure, in the operation, the single-chip dual-drive scanning circuit starts to drive the LED integrated panel 1 to operate. The bead 40 in the LED integrated panel 1 emits light. The light is emitted from the three beads 40 in the left row and the three beads 40 in the right row, retarded by the left eye retardation film 37 and the right eye retardation film 38 correspondingly provided in front of the three beads 40 in the left row and in front of the three beads 40 in the right row, and imaged angularly through the polarizing film 3 in front of the left eye retardation film 37 and the right eye retardation film 38. Consequently, the left eye and the right eye of the viewer respectively observe corresponding angles of the same object, and two parallax images are synthesized by the brain, thereby perceiving the 3D display.

However, as the temperature of the single-lamp dual-pixel 3D LED display module rises gradually, the LED heat dissipation structure 36 is fixed behind the LED integrated panel 1 through the dovetail groove 27 of the LED heat dissipation structure 36 and the dovetail pin 28 correspondingly provided on the front portion of the heat transfer cartridge 6. When the LED integrated panel 1 just starts to operate, the rear portion of the LED integrated panel 1 has a relatively low temperature. The temperature in the LED integrated panel 1 is transferred to the thermal expansion portion 8 through the heat transfer cartridge 6. Nonetheless, at a relatively low temperature, the paraffin in the energy storage cartridge 9 cannot change from the solid to the liquid. That is, the pressure in the energy storage cartridge 9 does not change, and the plunger 13 is located at a most front end of the plunger accommodation cartridge 12. By this time, there is a farthest distance along a radial direction between the stationary fin 18 connected to the top cover of the heat transfer cartridge 6 and the rotary fin 20 inserted into the gap between the two adjacent uniformly-spaced stationary fins 18. That is, the contact area between the stationary fin 18 and the rotary fin 20 is minimal, and the heat transferred to the heat dissipation portion 15 along the contact area is minimal.

After the novel single-lamp dual-pixel 3D LED display module operates for a certain time, the heat dissipated by the PCB in the LED integrated panel 1 is increased continuously, and the temperature in the LED integrated panel 1 is transferred to the thermal expansion portion 8 through the heat transfer cartridge 6. At a relatively high temperature, the paraffin in the energy storage cartridge 9 changes from the solid to the liquid. By this time, the pressure in the energy storage cartridge 9 rises to squeeze the plunger accommodation cartridge 12. Since the plunger accommodation cartridge 12 is made of the rubber material with certain elasticity, under an action of an outside pressure, the volume of the plunger accommodation cartridge 12 is decreased quickly to squeeze the plunger 13, and thus the plunger 13 tends to move backward. Since the inner side of the top cover of the heat transfer cartridge 6 abuts against the rear surface of the plunger 13, the plunger 13 cannot move backward. The plunger accommodation cartridge 12 moves forward before driven by a counter-acting force, the energy storage cartridge 9 fixedly connected to the rear end of the plunger accommodation cartridge 12 moves forward along the avoidance hole 30 and squeezes the reset spring 10, and the drive sleeve 23 fixedly connected to the energy storage cartridge 9 moves forward and drives the cylindrical pin 22 fixed with the inner wall of the drive sleeve 23 to move forward. The inner end of the cylindrical pin 22 is slidably connected to the correspondingly provided helical groove 21, such that a forward motion of the inner end of the cylindrical pin 22 is converted into rotation of the helical sleeve 16 along the axis. The changeable heat transfer fin 17 fixed in the inner cavity of the helical sleeve 16 and the eccentrically provided stationary fin 18 fixed on the top cover of the heat transfer cartridge 6 rotate relatively, such that the contact area between the changeable heat transfer fin 17 and the stationary fin 18 is increased. As the heat transfer area between the fins changes, the heat dissipating capacity is increased, such that the heat of the LED integrated panel 1 is taken away quickly. This ensures the adjustment on the temperature of the LED integrated panel 1, thereby effectively preventing the thermal shock to the PCB in the LED integrated panel 1.

What is claimed is:

1. A novel single-lamp dual-pixel three-dimensional (3D) light emitting diode (LED) display module, comprising an LED integrated panel provided with an LED single-lamp array, wherein the LED single-lamp array comprises a plurality of LED single lamps that are arranged symmetrically; the plurality of LED single lamps each comprise two LED light emitting pixels that are arranged left and right; the LED light emitting pixels each comprises a yellow LED bead, a green LED bead, and a blue LED bead; a left-right eye retardation film and a polarizing film are correspondingly provided on a front surface of the LED single-lamp array in sequence; a printed circuit board (PCB) is provided on a rear portion of the LED integrated panel; a driver chip is provided on the PCB; the driver chip is configured to control the corresponding LED light emitting pixel in the LED single-lamp array to emit light according to a preset rule; and an LED heat dissipation structure is provided behind the PCB;

wherein the LED heat dissipation structure comprises a heat-dissipating aluminum plate provided at a rear end of the LED integrated panel; a temperature sensing mechanism is further provided behind the heat-dissipating aluminum plate; the temperature sensing mechanism comprises a hollow heat transfer cartridge provided on a rear surface of the heat-dissipating aluminum plate; an inner cavity of the heat transfer cartridge is further concentrically provided with a thermal expansion portion; the thermal expansion portion is slidably connected to the heat transfer cartridge; the thermal expansion portion comprises an energy storage cartridge; the energy storage cartridge is shaped as a barrel with a rear end open and a front end sealed; a first flange plate is provided on a rear end surface of the energy storage cartridge; a plunger accommodation cartridge is further inserted into an opening at the rear end of the energy storage cartridge; a second flange plate is provided on a rear end surface of the plunger accommodation cartridge; the plunger accommodation cartridge is suspended on a rear portion of the energy storage cartridge; a front surface of the second flange plate of the plunger accommodation cartridge is closely attached to a rear end surface of the first flange plate; an outer surface of the plunger accommodation cartridge and an inner surface of the energy storage cartridge form a confined space; a plunger is further inserted into the plunger accommodation cartridge; a rear end of the plunger protrudes from the rear end surface of the plunger accommodation cartridge; the plunger accommodation cartridge is made of an elastic rubber material; and paraffin is filled in the confined space formed by the outer surface of the plunger accommodation cartridge and the inner surface of the energy storage cartridge;

wherein a heat dissipation fin adjusting mechanism is further provided behind the heat transfer cartridge; the heat dissipation fin adjusting mechanism comprises a changeable transfer portion and a heat dissipation portion; the changeable transfer portion is provided behind the heat transfer cartridge; the changeable transfer portion comprises a helical sleeve and a changeable heat transfer fin; the helical sleeve is sleeved on the changeable heat transfer fin; the helical sleeve and a top cover of the heat transfer cartridge are provided concentrically; the changeable heat transfer fin comprises a stationary fin provided eccentrically with the top cover of the heat transfer cartridge; the stationary fin is shaped as a circular disc and fixedly connected to the top cover of the heat transfer cartridge through a concentrically provided heat transfer pillar; a plurality of uniformly-spaced stationary fins are fixed on a rear portion of the heat transfer pillar; a rotary fin is inserted into a gap between two adjacent ones of the plurality of uniformly-spaced stationary fins; and the rotary fin comprises an inner end inserted into the gap between the two adjacent uniformly-spaced stationary fins, and an outer end fixed on an inner wall of the helical sleeve.

2. The novel single-lamp dual-pixel 3D LED display module according to claim 1, wherein the LED single lamp comprises a hollow lampshade and six LED beads provided on an inner rear end surface of the hollow lampshade; the six LED beads are formed into the two LED light emitting pixels that are arranged symmetrically left and right; and a rear end of the LED bead is welded at a corresponding position of the PCB through a pin.

3. The novel single-lamp dual-pixel 3D LED display module according to claim 2, wherein the left-right eye retardation film comprises a left eye retardation film and a right eye retardation film; and the left eye retardation film and the right eye retardation film are respectively provided in front of a corresponding left row of three beads and in front of a corresponding right row of three beads.

4. The novel single-lamp dual-pixel 3D LED display module according to claim 1, wherein the driver chip uses a single-chip dual-drive scanning circuit.

5. The novel single-lamp dual-pixel 3D LED display module according to claim 1, wherein an optical microcrystalline mask is further provided on a front surface of the LED integrated panel; the optical microcrystalline mask is formed between the LED integrated panel and the left-right eye retardation film by potting; and the optical microcrystalline mask is formed by a mixture of transparent crystal epoxy resin glue and a glass microsphere.

6. The novel single-lamp dual-pixel 3D LED display module according to claim 1, wherein an avoidance hole is formed at an axis of a bottom cover of the heat transfer cartridge; the energy storage cartridge is inserted into the avoidance hole and slidably connected to the bottom cover of the heat transfer cartridge; a front end surface of a top cover of the heat transfer cartridge abuts against a rear end surface of the plunger; a reset spring is further sleeved on the energy storage cartridge; and the reset spring comprises a first end fixed on the rear portion of the energy storage cartridge, and a second end fixed on a rear end surface of the bottom cover of the heat transfer cartridge.

7. The novel single-lamp dual-pixel 3D LED display module according to claim 1, wherein a helical groove is formed in an outer surface of the helical sleeve; a cylindrical pin is provided in the helical groove; the cylindrical pin is provided along a radial direction of the helical sleeve; and an inner end of the cylindrical pin is slidably connected to the corresponding helical groove.

8. The novel single-lamp dual-pixel 3D LED display module according to claim 7, wherein a drive sleeve is fixed at an outer end of the cylindrical pin; a bottom of the drive sleeve extends through the top cover of the heat transfer cartridge via a guide rod, and is fixedly connected to the energy storage cartridge; the top cover of the heat transfer cartridge is provided with a through hole corresponding to the guide rod; and the top cover of the heat transfer cartridge is slidably connected to the guide rod.

\* \* \* \* \*